(12) United States Patent
Huang et al.

(10) Patent No.: US 9,620,678 B2
(45) Date of Patent: Apr. 11, 2017

(54) ELECTRODE STRUCTURE OF LIGHT EMITTING DEVICE

(71) Applicant: PlayNitride Inc., Tainan (TW)

(72) Inventors: Shao-Hua Huang, Tainan (TW); Yun-Li Li, Tainan (TW)

(73) Assignee: PlayNitride Inc., Tainan (TW)

( * ) Notice: Subject to any disclaimer, the term of this patent is extended or adjusted under 35 U.S.C. 154(b) by 0 days.

(21) Appl. No.: 14/922,213

(22) Filed: Oct. 26, 2015

(65) Prior Publication Data

US 2016/0141456 A1    May 19, 2016

Related U.S. Application Data

(60) Provisional application No. 62/081,503, filed on Nov. 18, 2014, provisional application No. 62/092,265, filed on Dec. 16, 2014.

(30) Foreign Application Priority Data

May 6, 2015 (TW) .............................. 104114435 A

(51) Int. Cl.
    H01L 33/36    (2010.01)
    H01L 33/38    (2010.01)
    H01L 33/62    (2010.01)

(52) U.S. Cl.
    CPC .............. *H01L 33/38* (2013.01); *H01L 33/62* (2013.01)

(58) Field of Classification Search
    None
    See application file for complete search history.

(56) References Cited

U.S. PATENT DOCUMENTS

2013/0264592 A1*  10/2013  Bergmann .............. H01L 33/50
                                                        257/88

FOREIGN PATENT DOCUMENTS

TW            201417338          5/2014

OTHER PUBLICATIONS

"Office Action of Taiwan Counterpart Application", issued on May 12, 2016, p. 1-p. 5.

* cited by examiner

*Primary Examiner* — Reema Patel
(74) *Attorney, Agent, or Firm* — Jianq Chyun IP Office

(57) ABSTRACT

An electrode structure of a light emitting device includes a plurality of first electrodes and a plurality of second electrodes. The first electrodes electrically contact with the light emitting device and are separated from one other. The second electrodes electrically contact with the light emitting device and are located at the same side with the first electrodes. The second electrodes are separated from one other, and the second electrodes have at least two different profiles when viewing from atop.

14 Claims, 5 Drawing Sheets

ELECTRODE STRUCTURE OF LIGHT EMITTING DEVICE

CROSS-REFERENCE TO RELATED APPLICATION

This application claims the priority benefits of U.S. provisional application Ser. No. 62/081,503, filed on Nov. 18, 2014, U.S. provisional application Ser. No. 62/092,265, filed on Dec. 16, 2014 and Taiwan application serial No. 104114435, filed on May 6, 2015. The entirety of each of the above-mentioned patent applications is hereby incorporated by reference herein and made a part of this specification.

BACKGROUND OF THE DISCLOSURE

1. Field of the Disclosure

The disclosure generally relates to an electrode structure, and particularly to an electrode structure of a light emitting device.

2. Description of Related Art

In general, a light emitting diode structure is composed of an epitaxial structure, a P-type electrode and an N-type electrode, wherein the P-type electrode is electrically connected to the P-type semiconductor layer of the epitaxial structure, and the N-type electrode is electrically connected to the N-type semiconductor layer of the epitaxial structure. Generally, for the sake of convenience of fabricating process, the N-type and P-type electrodes are disposed in a continuous type. However, the continuous type electrode design may induce a higher proportion of the occupying area of the electrodes and thereby reducing the light emitting region. Therefore, the continuous-type electrode design may deteriorate luminance efficiency of the light emitting diode. In addition, if the N-type electrode and the P-type electrode are disposed dispersedly, the electrode area may become insufficient, thereby causing the forward voltage and the junction temperature of the P-N interface increased.

SUMMARY OF THE DISCLOSURE

The disclosure provides an electrode structure of a light emitting device, capable of effectively increasing luminance efficiency of the light emitting diode and effectively reducing the forward voltage thereof.

The electrode structure of the light emitting device of the disclosure includes a plurality of first electrodes and a plurality of second electrodes. The first electrodes are electrically connected to the light emitting device, and the first electrodes are separated from one other. The second electrodes are electrically connected to the light emitting device, and the first electrodes and the second electrodes are located at the same side. The second electrodes are separated from one another, and the second electrodes have at least two different profiles when viewing from atop.

According to an exemplary embodiment of the disclosure, the profile of each of the first electrodes when viewing from atop is in a point shape.

According to an exemplary embodiment of the disclosure, the first electrodes are spaced at equidistant intervals and adjacent to the same side of the light emitting device.

According to an exemplary embodiment of the disclosure, the profile of the second electrodes when viewing from atop is a combination of a point shape and a line shape.

According to an exemplary embodiment of the disclosure, the second electrodes which have the profile of the point shape when viewing from atop are defined as a plurality of point-shaped electrodes, and the second electrodes which have the profile of the line shape when viewing from atop are defined as a plurality of line-shaped electrodes.

According to an exemplary embodiment of the disclosure, the top view area of each of the line-shaped electrodes is 5 to 20 times the top view area of each of the point-shaped electrodes.

According to an exemplary embodiment of the disclosure, the line-shaped electrodes are located among the point-shaped electrodes.

According to an exemplary embodiment of the disclosure, the point-shaped electrodes are located among the line-shaped electrodes.

According to an exemplary embodiment of the disclosure, the point-shaped electrodes and the line-shaped electrodes are arranged alternately.

According to an exemplary embodiment of the disclosure, the line-shaped electrodes have an extending direction, and the point-shaped electrodes are arranged in the extending direction of the line-shaped electrodes.

According to an exemplary embodiment of the disclosure, the first electrodes and the second electrodes are disposed correspondingly, and the number of the first electrodes is equal to the number of rows of the point-shaped electrodes and the line-shaped electrodes of the second electrodes which are arranged.

According to an exemplary embodiment of the disclosure, the distance between any of the two adjacent point-shaped electrodes of the second electrodes is equal to or greater than the distance between any of the two adjacent first electrodes.

According to an exemplary embodiment of the disclosure, the electrode structure of the light emitting device further includes a first bonding pad and a second bonding pad. The first bonding pad is disposed on a side of the light emitting device and electrically connected to the first electrodes. The second bonding pad is electrically connected to the second electrodes, the second bonding pad and the first bonding pad are located at the same side of the light emitting device, wherein edges of the light emitting device are aligned with edges of the first bonding pad and edges of the second bonding pad.

According to an exemplary embodiment of the disclosure, each of the first electrodes is a P-type electrode, and each of the second electrodes is an N-type electrode.

In light of the above, in the electrode structure of the light emitting device provided in the disclosure, the second electrodes have at least two different profiles when viewing from atop, thus the current distribution may become more uniform, the light emitting efficiency of the light emitting device may not be affected, and the forward voltage thereof may further be effectively reduced.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
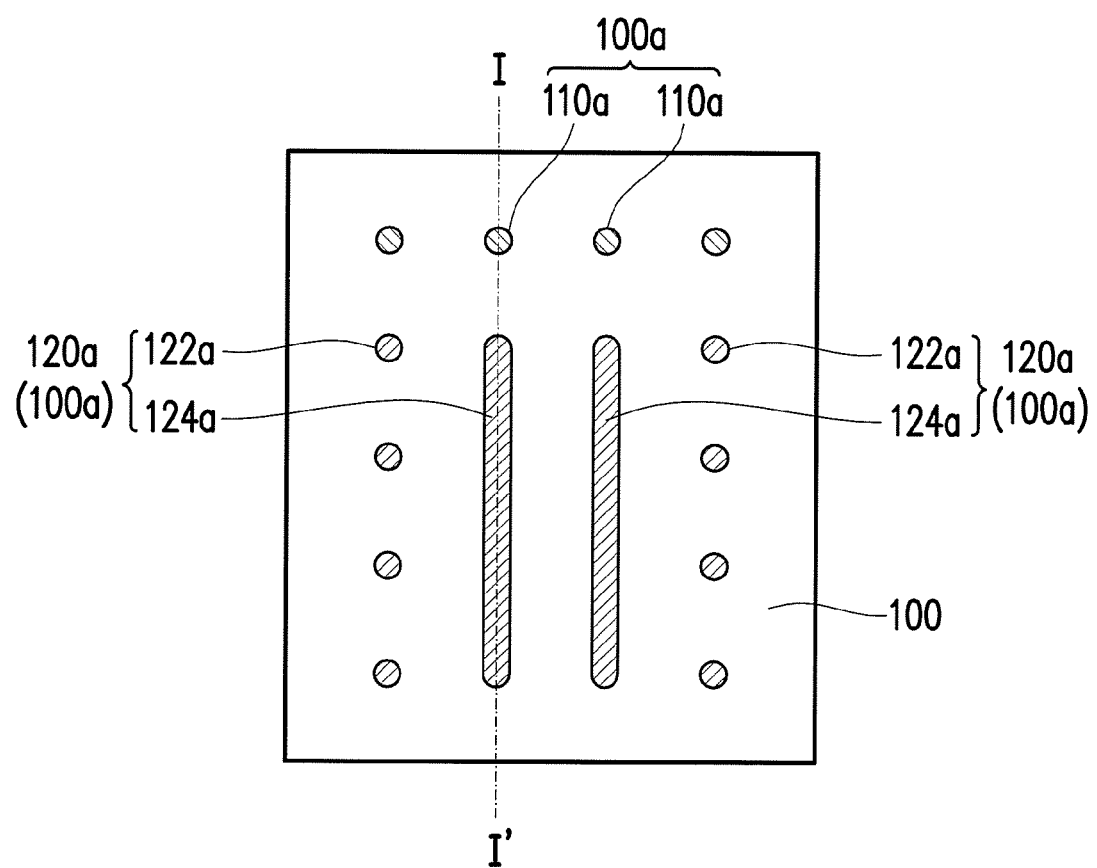
FIG. 1A is a schematic top view illustrating an electrode structure of a light emitting device according to one embodiment of the disclosure.
Figure 1B:
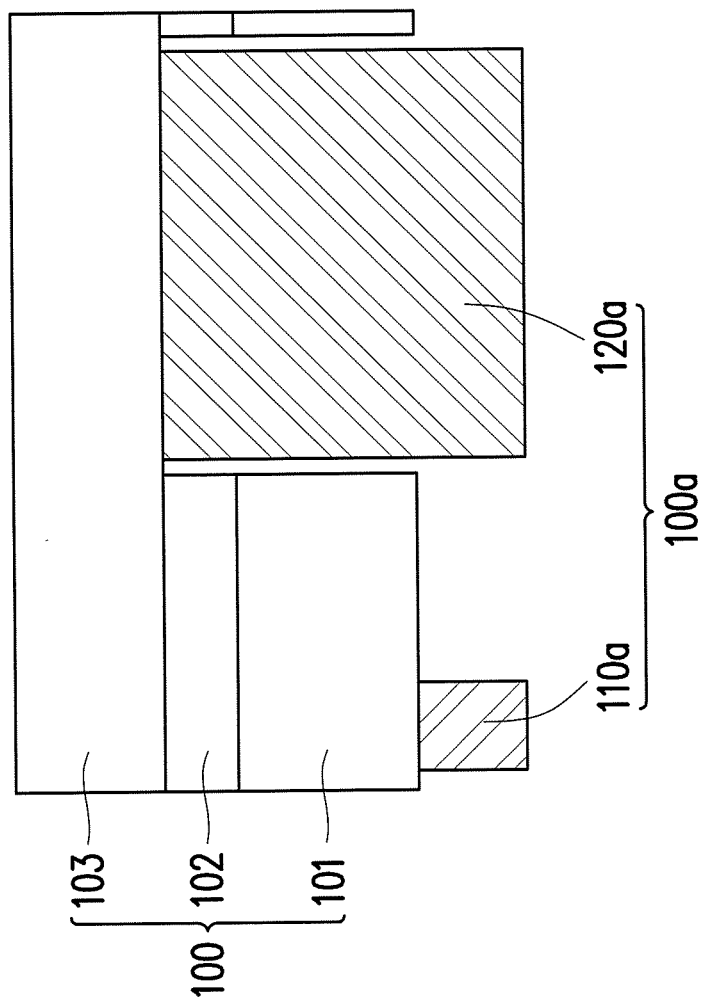
FIG. 1B is a schematic cross-sectional view taken along line I-I' in FIG. 1A.

FIG. 1A is a schematic top view illustrating an electrode structure of a light emitting device according to one embodiment of the disclosure. FIG. 1B is a schematic cross-sectional view taken along line I-I' in FIG. 1A. Referring to FIG. 1A and FIG. 1B, in the present embodiment, an electrode structure 100a of a light emitting device 100 includes a plurality of first electrodes 110a (4 of them are schematically shown in FIG. 1A) and a plurality of second electrodes 120a (10 of them are schematically shown in FIG. 1A). The first electrodes 110a are electrically connected to the light emitting device 100, and the first electrodes 110a are separated from one other. The second electrodes 120a are electrically connected to the light emitting device 100, and the first electrodes 110a and the second electrodes 120a are located at the same side. The second electrodes 120a are separated from one another, and the second electrodes 120a have at least two different profiles when viewing from atop. As shown in FIG. 1A, in the present embodiment, the second electrodes 120a have two different profiles when viewing from atop.

As shown in FIG. 1B, the light emitting device 100 of the embodiment includes a first-type semiconductor layer 101, a light emitting layer 102 and a second-type semiconductor layer 103, wherein the light emitting layer 102 is located between the first-type semiconductor layer 101 and the second-type semiconductor layer 103. The first electrodes 110a and the first-type semiconductor layer 101 are contact and electrically connected, and the second electrodes 120a and the second-type semiconductor layer 103 are contact and electrically connected. Herein, the first-type semiconductor layer 101 is a P-type semiconductor layer, for example, and the second-type semiconductor layer 103 is an N-type semiconductor layer. On the other hand, the first electrodes 110a which are electrically connected to the first-type semiconductor layer 101 may be P-type electrodes, and the second electrodes 120a which are electrically connected to the second-type semiconductor layer 103 may be N-type electrodes, however the disclosure is not limited to the abovementioned embodiment.

In detailed, as shown in FIG. 1A, the profile of each of the first electrodes 110a of the embodiment is a point shape when viewing from atop, and the first electrodes 110a have the same profiles when viewing from atop, wherein the profiles of the first electrodes 110a when viewing from atop may be in square-point shape or circular-point shape, and the circular-point shape which has a comparatively lower resistance so as to obtain a better electrical connection is preferable. Herein, the first electrodes 110a are spaced at equidistant intervals and adjacent to the same side of the light emitting device 100. Moreover, the profile of the second electrodes 120a when viewing from atop is a combination of a point shape and a line shape, for example, a combination of a square-point shape or a circular-point shape and a line shape, and a combination of a circular-point shape and a line shape which has a lower resistance so as to obtain a better electrical connection is preferable.

More specifically, in the present embodiment, the second electrodes 120a which have the profile of the point shape when viewing from atop are defined as a plurality of point-shaped electrodes 122a (8 of them are schematically shown in FIG. 1A), and the second electrodes 120a which have the profile of the line shape when viewing from atop are defined as a plurality of line-shaped electrodes 124a (2 of them are schematically shown in FIG. 1A). Herein, the line-shaped electrodes 124a are located among the point-shaped electrodes 122a, such that the line-shaped electrodes 124a which are located in the center may provide a better electrical connection, and the point-shaped electrodes 122a which are located at the two sides may increase the current passing through the edges in order to achieve a better current distribution. What should be noted is that the top view area of each of the line-shaped electrodes 124a is 5 to 20 times the top view area of each of the point-shaped electrodes 122a, wherein the line-shaped electrodes 124a may not be able to provide a better electrical connection if less than 5 times, and if larger than 20 times the area of the line-shaped electrodes 124a may become too large and thereby reducing the light emitting region.

More specifically, the line-shaped electrodes 124a have an extending direction, and the point-shaped electrodes 122a are arranged in a plurality of rows in equidistant intervals in the extending direction, however they also may not be arranged in equidistant intervals. As shown in FIG. 1A, the point-shaped electrodes 122a are arranged in two rows. In addition, herein each of the line-shaped electrodes 124a is specified into continuous line-shaped electrode, however the disclosure is not limited thereto. Especially, the first electrodes 110a and the second electrodes 120a are disposed correspondingly, and the number of the first electrodes 110a is equal to the number of rows of the point-shaped electrodes 122a and the line-shaped electrodes 124a of the second electrodes 120a which are arranged. Through correspondingly disposing, the current may be uniformly guided into the first-type semiconductor layer 101 and the second-type semiconductor layer 103, thereby suppressing the crowded current problem. Herein, the first electrodes 110a are 4, and the point-shaped electrodes 122a and the line-shaped electrodes 124a are arranged in 4 rows. What should be noted is that the distance between any of the two adjacent point-shaped electrodes 122a is equal to or greater than the distance between any of the two adjacent first electrodes 110a, and through such configuration, the current may be effectively guided to the edge region of the light emitting device 100, so that the current distribution is uniform.

In the electrode structure 100a of the light emitting device 100 of the embodiment, the second electrodes 120a have at least two different profiles when viewing from atop, such as point shape or line shape, thus the current distribution may become more effectively uniform and the forward voltage thereof may further be effectively reduced.

Figure 2A:
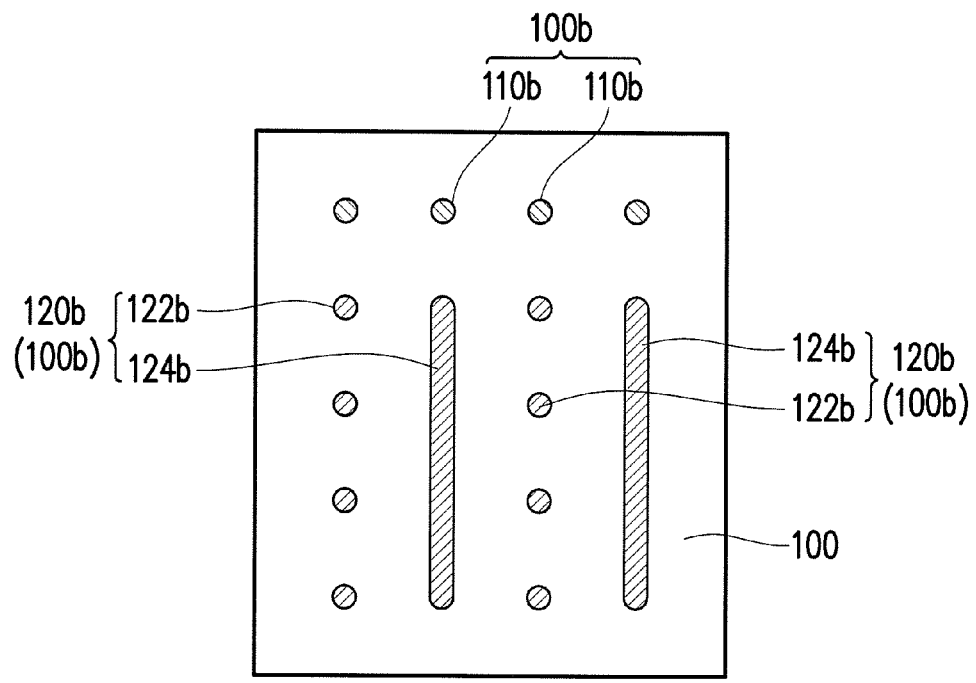
FIG. 2A is a schematic top view illustrating an electrode structure of a light emitting device according to another embodiment of the disclosure.
Figure 2B:
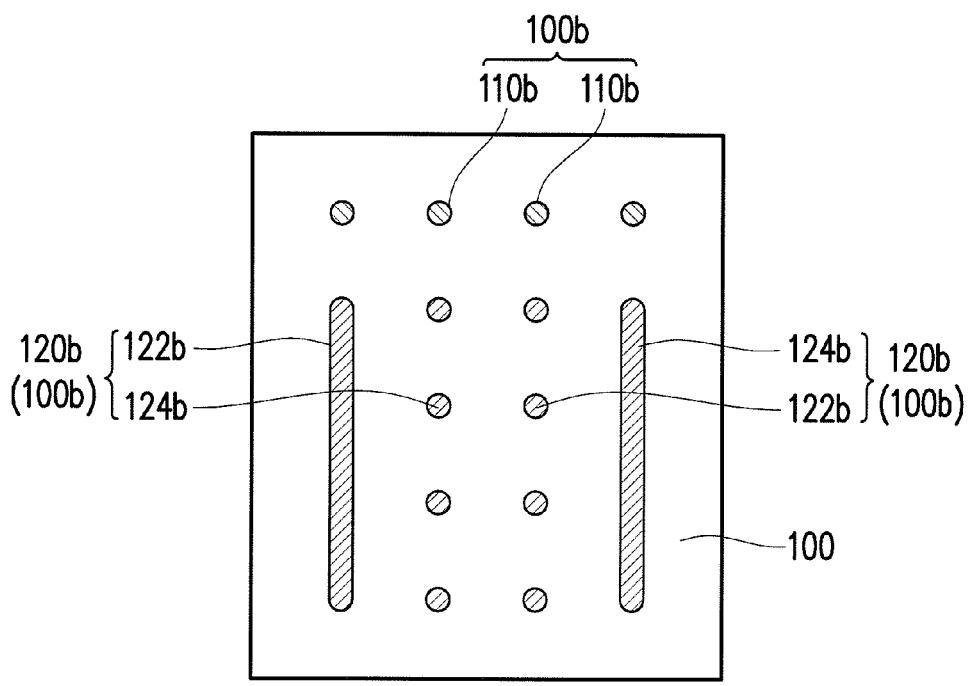
FIG. 2B is a schematic top view illustrating an electrode structure of a light emitting device according to another embodiment of the disclosure.

FIG. 2A is a schematic top view illustrating an electrode structure of a light emitting device according to another embodiment of the disclosure. Referring to FIG. 2A and FIG. 1A, the electrode structure 100b of the light emitting device 100 of the present embodiment is similar to the electrode structure 100a of the light emitting device 100 shown in FIG. 1A, the main difference is that: the point-shaped electrodes 122b and the line-shaped electrodes 124b of the second electrodes 120b of the present embodiment are disposed alternately. More specifically, the point-shaped electrodes 122b are arranged in two rows, and the line-shaped electrodes 124b and the point-shaped electrodes 122b are disposed alternately. Through alternately arranged design, the lateral light emitting may be increased and the viewing angle of the light emitting device 100 may further be enlarged. In other embodiments, also as shown in FIG. 2B, the point-shaped electrodes 122b are located among the line-shaped electrodes 124b. Through such design, the vertical light emission is greater than the lateral light emission, and the viewing angle of the light emitting device 100 may be controlled in a range of +/−70 degrees, which is still a part of the technical proposal of the disclosure.

Figure 3:
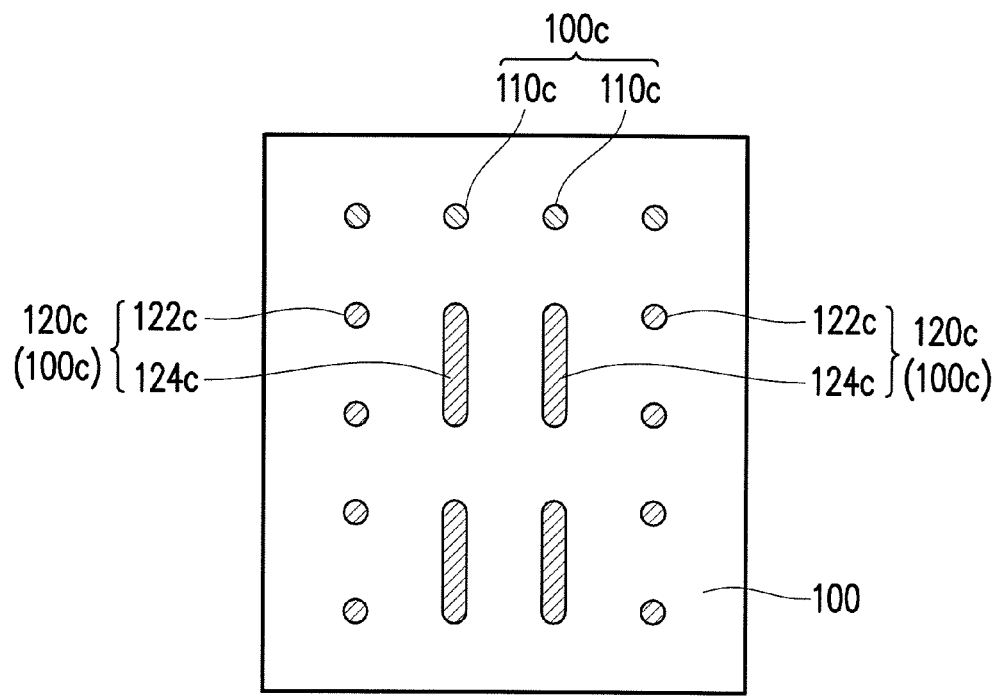
FIG. 3 is a schematic top view illustrating an electrode structure of a light emitting device according to another embodiment of the disclosure.

FIG. 3 is a schematic top view illustrating an electrode structure of a light emitting device according to another embodiment of the disclosure. Referring to FIG. 3 and FIG. 1A, the electrode structure 100c of the light emitting device 100 of the present embodiment is similar to the electrode structure 100a of the light emitting device 100 shown in FIG. 1A, the main difference is that: each of the line-shaped electrodes 124c of the second electrodes 120c of the present embodiment is a non-continuous line-shaped electrode. More specifically, each of the line-shaped electrodes 124c is composed of two segments of line-shaped electrode, wherein the two segments of line-shaped electrode are separated from each other and arranged in the same extending direction, and through such design, the light shielding problem of the line-shaped electrodes may be reduced.

Figure 4:
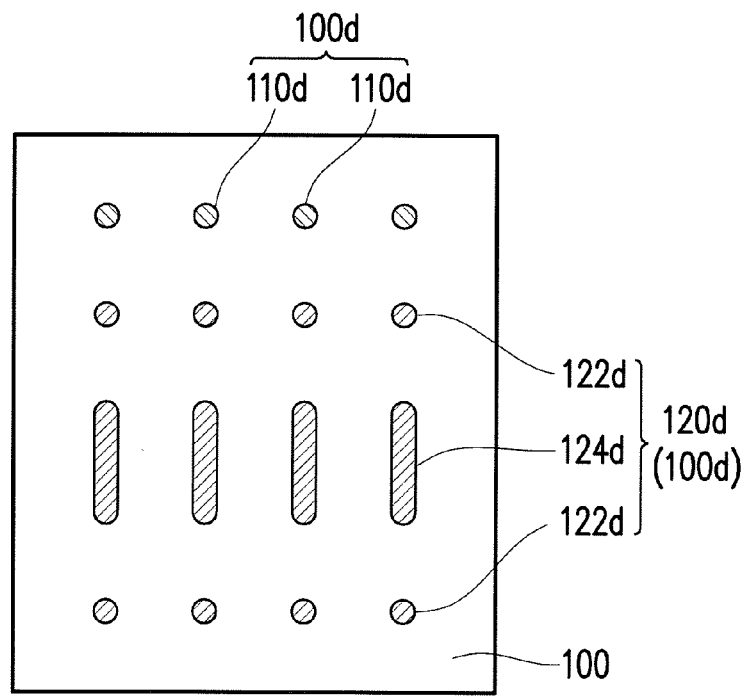
FIG. 4 is a schematic top view illustrating an electrode structure of a light emitting device according to another embodiment of the disclosure.

FIG. 4 is a schematic top view illustrating an electrode structure of a light emitting device according to another embodiment of the disclosure. Referring to FIG. 4 and FIG. 1A, the electrode structure 100d of the light emitting device 100 of the present embodiment is similar to the electrode structure 100a of the light emitting device 100 shown in FIG. 1A, the main difference is that: each of the point-shaped electrodes 122d and each of the line-shaped electrodes 124d of the present embodiment are disposed alternately. More specifically, the point-shaped electrodes 122d and the line-shaped electrodes 124d are separately arranged in rows, thereby providing a more uniform current distribution to the light emitting device 100.

Figure 5:
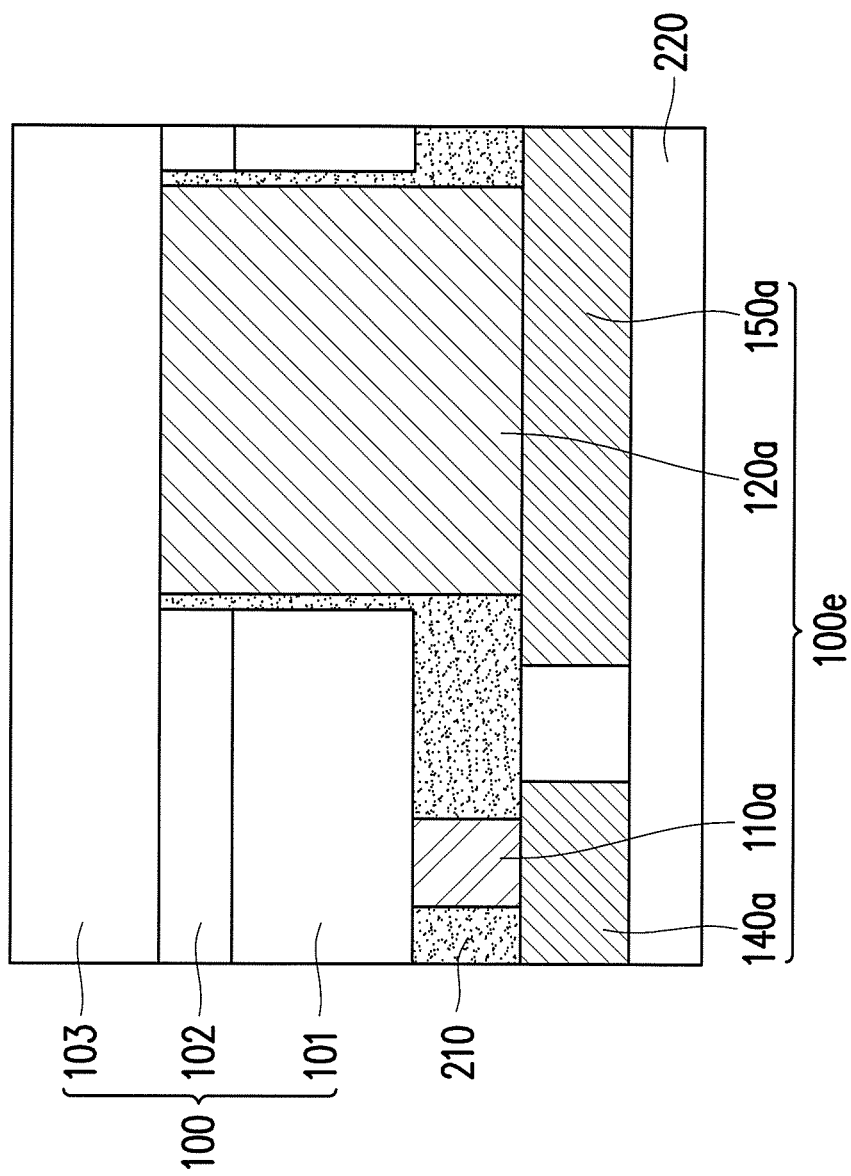
FIG. 5 is a schematic cross-sectional view taken along line I-I' in FIG. 1A according to another embodiment.

FIG. 5 is a schematic top view illustrating an electrode structure of a light emitting device according to another embodiment of the disclosure. Referring to FIG. 5 and FIG. 1B, the electrode structure 100e of the light emitting device 100 of the present embodiment is similar to the electrode structure 100a of the light emitting device 100 shown in FIG. 1B, the main difference is that: the electrode structure 100e of the light emitting device 100 of the present embodiment further includes a first bonding pad 140a and a second bonding pad 150a.

The first bonding pad 140a is disposed on one side of the light emitting device 100 and electrically connected to the first electrodes 110a. The second bonding pad 150a is electrically connected to the second electrodes 120a, and the second bonding pad 150a and the first bonding pad 140a are located at the same side of the light emitting device 100, wherein the first bonding pad 140a and the second bonding pad 150a are electrically insulated from each other, and the edges of the light emitting device 100 are aligned with the edges of the first bonding pad 140a and the edges of the second bonding pad 150a. Especially, herein the top view area of the second bonding pad 150a is greater than the top view area of the first bonding pad 140a, such that the second electrodes 120a having at least two different profiles when viewing from atop and the second bonding pad 150a may have a better connection.

In the embodiment, the first bonding pad 140a and the second bonding pad 150a are disposed for increasing the contact area between an external circuit (not shown in the drawings) and the first and second electrodes 110a and 120a, and in order that the heat produced by the light emitting device 100 may also be rapidly dissipated to outside through the first bonding pad 140a and the second bonding pad 150a. In order that the first electrodes 110a and the second electrodes 120a are electrically insulated and the first bonding pad 140a and the second bonding pad 150a are electrically insulated, an insulating layer 210 shown in FIG. 5 may also be disposed. When the first and second bonding pads 140a and 150a and a package substrate 220 are bonded, the edges of the package substrate 220 and the edges of the first bonding pad 140a and the edges of the second bonding pad 150a may be aligned, so that the package may have a comparatively smaller volume. In addition, the type of the package substrate is not limited, as long as the substrate is a ceramic substrate, a silicon substrate, a glass substrate, a sapphire substrate or a printed circuit board, having a through hole, and in application if an external circuit (not shown in the drawings) is provided via the package substrate 220, the abovementioned structure may emit light.

In light of the foregoing, in the electrode structure of the light emitting device provided in the disclosure, the second electrodes have at least two different profiles when viewing from atop, thus the current distribution may become more uniform, and the forward voltage thereof may further be effectively reduced.

Although the disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. An electrode structure of a light emitting device, comprising:
   a plurality of first electrodes electrically connected to the light emitting device, wherein the first electrodes are separated from one another; and
   a plurality of second electrodes electrically connected to the light emitting device, the first electrodes and the second electrodes located at a same side, wherein the second electrodes are separated from one another, and the second electrodes have at least two different profiles when viewing from atop, the light emitting device includes a first-type semiconductor layer and a second-type semiconductor layer, wherein all of the first electrodes are connected to the first-type semiconductor layer and all of the second electrodes are connected to the second-type semiconductor layer.

2. The electrode structure of the light emitting device as claimed in claim 1, wherein a profile of each of the first electrodes when viewing from atop is in a point shape.

3. The electrode structure of the light emitting device as claimed in claim 1, wherein the first electrodes are spaced at equidistant intervals and adjacent to a same side of the light emitting device.

4. The electrode structure of the light emitting device as claimed in claim 1, wherein a profile of the second electrodes when viewing from atop is a combination of a point shape and a line shape.

5. The electrode structure of the light emitting device as claimed in claim 4, wherein the second electrodes which have the profile of the point shape when viewing from atop are defined as a plurality of point-shaped electrodes, and the second electrodes which have the profile of the line shape when viewing from atop are defined as a plurality of line-shaped electrodes.

6. The electrode structure of the light emitting device as claimed in claim 5, wherein a top view area of each of the line-shaped electrodes is 5 to 20 times a top view area of each of the point-shaped electrodes.

7. The electrode structure of the light emitting device as claimed in claim 5, wherein the line-shaped electrodes are located among the point-shaped electrodes.

8. The electrode structure of the light emitting device as claimed in claim 5, wherein the point-shaped electrodes are located among the line-shaped electrodes.

9. The electrode structure of the light emitting device as claimed in claim 5, wherein the point-shaped electrodes and the line-shaped electrodes are arranged alternately.

10. The electrode structure of the light emitting device as claimed in claim 5, wherein the line-shaped electrodes have an extending direction, and the point-shaped electrodes are arranged in the extending direction of the line-shaped electrodes.

11. The electrode structure of the light emitting device as claimed in claim 10, wherein the first electrodes and the second electrodes are disposed correspondingly, and a number of the first electrodes is equal to a number of rows of the point-shaped electrodes and the line-shaped electrodes of the second electrodes which are arranged.

12. The electrode structure of the light emitting device as claimed in claim 10, wherein a distance between any of the two adjacent point-shaped electrodes of the second electrodes is equal to or greater than a distance between any of the two adjacent first electrodes.

13. The electrode structure of the light emitting device as claimed in claim 1, further comprising:
   a first bonding pad disposed on a side of the light emitting device and electrically connected to the first electrodes; and
   a second bonding pad electrically connected to the second electrodes and the second bonding pad and the first bonding pad located at the same side of the light emitting device, wherein the first bonding pad and the second bonding pad are electrically insulated from each other, and edges of the light emitting device are aligned with edges of the first bonding pad and edges of the second bonding pad.

14. The electrode structure of the light emitting device as claimed in claim 1, wherein each of the first electrodes is a P-type electrode, and each of the second electrodes is an N-type electrode.

* * * * *